United States Patent [19]

Malhi

[11] Patent Number: 5,350,932
[45] Date of Patent: Sep. 27, 1994

[54] HIGH VOLTAGE STRUCTURES WITH OXIDE ISOLATED SOURCE AND RESURF DRIFT REGION IN BULK SILICON

[75] Inventor: Satwinder Malhi, Garland, Tex.

[73] Assignee: Texas Instruments Incorporated, Dallas, Tex.

[21] Appl. No.: 169,731

[22] Filed: Dec. 17, 1993

Related U.S. Application Data

[63] Continuation of Ser. No. 92,664, Jul. 15, 1993, abandoned, which is a continuation of Ser. No. 857,861, Mar. 26, 1992, abandoned.

[51] Int. Cl.$^5$ .............................................. H04L 29/10
[52] U.S. Cl. .......................................... 257/67; 257/51; 257/318; 257/344; 257/401
[58] Field of Search ................... 357/23.4, 23.6, 23.7; 257/51, 67, 318, 394, 401

[56] References Cited

U.S. PATENT DOCUMENTS 4,752,814  6/1988  Tuan ................................... 357/23.7
5,072,269 12/1991  Hieda ............................. 357/23.6 G

FOREIGN PATENT DOCUMENTS 58-007870  1/1983  Japan .

OTHER PUBLICATIONS

H. Kitajima, Y. Suzuki and S. Saito; Microelectronics Research Lab., NEC Corp. Sagamihara 229, Japan; *Leakage Current Reduction in Sub-Micron Challel Poly-Si TFT's;* 2419 Japanese Journal of Applied physics, Int. Conf. on Solid State Devices and Materials (1991) Aug. 27–29, Yokohama, Japan, JP pp. 174–176.

Primary Examiner—Edward Wojciechowicz
Attorney, Agent, or Firm—Robby T. Holland; Thomas G. Eschweiler; Richard L. Donaldson

[57] ABSTRACT

An integrated circuit RESURF LDMOS power transistor employs a source isolated, embedded gate MOS transistor with RESURF LDMOS technology to provide a source isolated high voltage power transistor with low "on" resistance for use in applications requiring electrical isolation between the source and substrate.

15 Claims, 1 Drawing Sheet

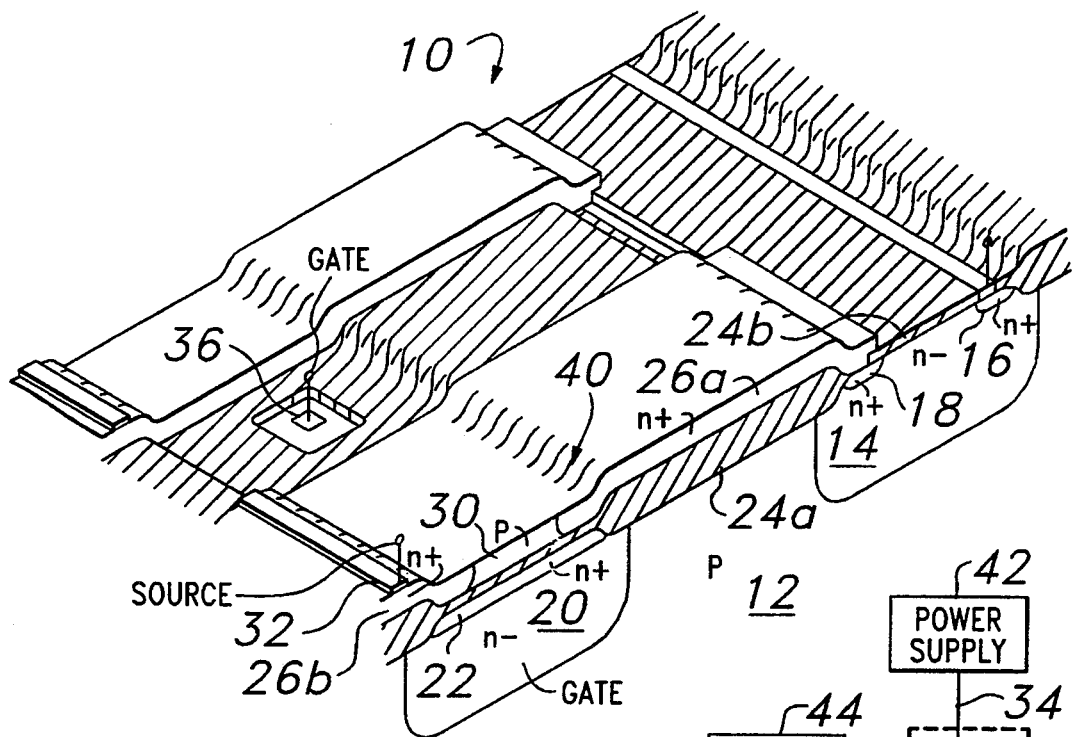
Fig. 1
Fig. 2
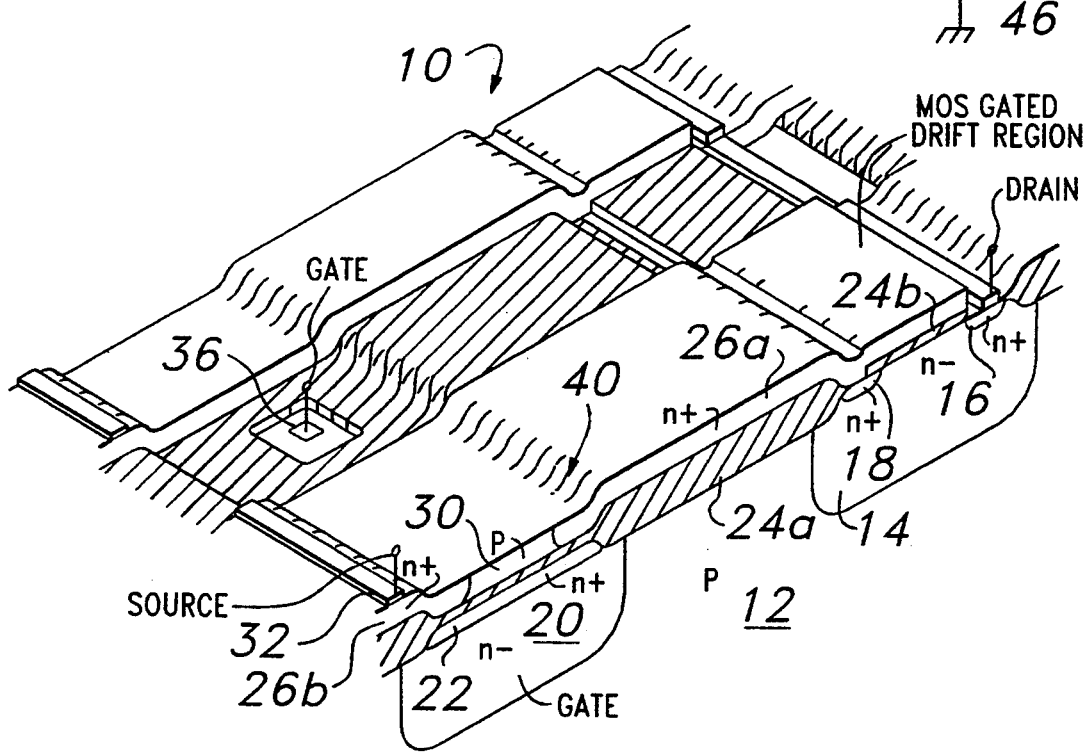
Fig. 3

HIGH VOLTAGE STRUCTURES WITH OXIDE ISOLATED SOURCE AND RESURF DRIFT REGION IN BULK SILICON

This application is a continuation of application Ser. No. 08/092,664, filed Jul. 15, 1993, now abandoned which is a continuation of application Ser. No. 07/857,861, filed Mar. 26, 1992, now abandoned.

FIELD OF THE INVENTION

This invention is in the field of semiconductor integrated circuits and relates primarily to high power devices.

BACKGROUND OF THE INVENTION

In the field of power integrated circuits much work has been done in the development of power transistors. Advancements were made enabling LDMOS power transistors (lateral double diffused MOS transistor) to exhibit low "on-resistance" (RDSon) and high breakdown capability concurrently through a reduced surface field (RESURF) technique (J. A. Appels and H. M. J. Vaes, "High Voltage Thin Layer Devices (RESURF Devices)", IEDM Tech. Digest, pp. 238-241, 1979).

In the past, RESURF LDMOS transistors commonly were used in low side driver applications because the transistor structure coupled the source to the substrate which in turn was coupled to ground. (A low side driver configuration consists of the source of the LDMOS transistor coupled to ground and the drain coupled to an output load.) Therefore, RESURF LDMOS transistors were not utilized in high side driver applications and other applications that mandated electrical isolation between the source and substrate. (A high side driver configuration consists of the LDMOS transistor drain coupled to circuitry or a power supply and the source coupled to an output load.)

It is an object of this invention to provide a high power integrated circuit device with electrical isolation between source and substrate. It is another object of this invention to provide a LDMOS transistor with an isolated source and RESURF drift region. Other objects and advantages of the invention will become apparent to those of ordinary skill in the art having reference to the following specification together with the drawings herein.

SUMMARY OF THE INVENTION

An integrated circuit RESURF LDMOS power transistor combines a source isolated, embedded gate MOS transistor with RESURF LDMOS technology to provide a source isolated high voltage power transistor with low "on" resistance for use in applications where the source is required to be electrically isolated from the substrate.

BRIEF DESCRIPTION OF THE DRAWINGS

FIG. 1 is a three dimensional drawing illustrating the preferred embodiment of the invention.

FIG. 2 is a block diagram illustrating a high side driver circuit configuration.

FIG. 3 is a three dimensional drawing illustrating an alternative embodiment of the invention.

DESCRIPTION OF THE PREFERRED EMBODIMENT

FIG. 1 is a cross section drawing illustrating the preferred embodiment of the invention. A RESURF LDMOS transistor 10 has a P type substrate 12. A patterned oxide layer 24a is formed over the face of the substrate 12 using a standard LOCOS process with two openings provided for implants. An implant forms an N− type drain drift region 14 and an N− type gate isolation region 20 in the P type substrate 12. A patterned oxide layer 24b is formed over the drain drift region 14 with an opening separating the thick oxide 24a overlying the substrate 12 and the oxide 24b overlying the drain drift region 14. A P type doped polysilicon layer 30 is formed over the oxide layers 24a and 24b and forms the channel 30 of the transistor 10. The P type polysilicon layer 30 is etched to remove a portion of the polysilicon lying over the oxide layer 24b. A photoresist is deposited over a portion of the P type poly channel 30 overlying the gate isolation region while an N+ type implant dopes the remaining portion of the poly layer. The N+ type implant forms N+ type contact diffusions 16 and 18 in the drain drift region 14. This process step also forms an N+ type drain interconnect 26a which connects the drain drift region 14 through contact diffusion 18 to the channel 30 and an N+ type source 26b formed on the other side of the poly channel 30. The photoresist is then removed. A patterned oxide layer (not shown in FIG. 1) is formed over the transistor 10 with holes opened for the formation of metal contacts. A patterned metal layer is formed over the transistor 10 forming a source contact 32, a gate contact 36, and a drain contact 34.

The invention illustrated in FIG. 1 provides a source isolated (source 26b electrically isolated from the substrate 12), embedded gate NMOS transistor 40 coupled to a RESURF drain drift region 14 to form a RESURF LDMOS transistor 10 for use in applications mandating electrical isolation between the source 26b and substrate 12. The source isolated, embedded gate NMOS transistor 40 is constructed upside-down with respect to a conventional NMOS transistor construction in the substrate 12. The N+ type diffusion 22 serves as the gate of the transistor 40 and the thin portion of insulating layer 24a overlying gate region 22 serves as a gate oxide for the transistor 40. The channel 30, on top of the insulating layer 24, completes the upside-down transistor 40 construction. The gate oxide is high quality since it is formed over gate diffusion 22 (diffusions made in a single crystal silicon substrate become single crystal silicon diffusions). The single crystal silicon gate diffusion 22 allows the gate oxide to be very thin thus maximizing current drive which is well known by those skilled in the art. This is also readily seen in the current equation for an NMOS transistor (for W/L=unity):

$$I_D = (\mu \epsilon / 2 t_{ox})(V_{GS} - V_t)^2$$

The gate oxide thickness ($t_{ox}$) is located in the denominator of the equation and is therefore inversely proportional to the current drive capability ($I_D$). Thus, the thinner the gate oxide ($t_{ox}$) can be made the better the current drive of the transistor will become.

FIG. 2 illustrates transistor 10 of FIG. 1 connected in a high side driver configuration. The drain contact 34 is connected to power supply 42. The gate contact 36 is connected to control circuitry 44 and the source contact 32 is connected to load 46.

RESURF LDMOS transistor 10 of FIG. 1 operates in the following manner under normal conditions. When a positive voltage greater in magnitude than the device threshold voltage ($V_t$, usually 1–2 V) appears on the transistor gate contact 36 the channel 30 conducts and current flows from the drain contact 34, through the drain contact diffusion 16, through the drain drift region 14, through the second drain contact diffusion 18, through the polysilicon drain interconnect 26a, through the polysilicon channel 30, through the polysilicon source 26b, and finally through the source contact 32. When a voltage lower than the device threshold voltage appears on the transistor gate contact 36 the polysilicon channel 30 does not conduct and the transistor 10 behaves like an open circuit.

RESURF LDMOS transistor 10 of FIG. 1 advantageously operates in a manner such that the power transistor's reliability is not compromised during breakdown conditions. (The breakdown voltage magnitude of a RESURF LDMOS transistor is a complex function of the drain drift region 14 length, depth, and doping concentration; breakdown voltage ratings may vary widely, from 40–500 V.) During a power supply transient the drain contact 34 is coupled to the power supply and therefore the transient voltage appears on the drain contact 34. When a transient voltage appears at the drain contact 34 that exceeds the transistor 10 breakdown rating, the drain drift region 14 of the transistor 10 becomes fully depleted. Most of the voltage drop occurs across the drain drift region 14 such that only 5–10 volts will drop across the source isolated, embedded gate NMOS transistor 40. When the drain drift region 14 becomes fully depleted, the junction between the drain drift region 14 and substrate 12 breaks down. Since the breakdown site is well within the bulk of substrate 12, no charge is injected into surface oxides 24a thereby prohibiting unstable or walking breakdown phenomena.

FIG. 3 is a three dimensional drawing illustrating an alternative embodiment of the invention. In this embodiment, RESURF LDMOS transistor 10 the drain interconnect 26a extends over the insulating layer 24b and forms a MOS gated drift region 26a. This alternative embodiment provides improved RDSon ("on" resistance) through use of the MOS gated drift region 26a.

In FIG. 3 during a breakdown condition, the majority of voltage drops across drain drift region 14 thus causing the voltage drop across the source isolated, embedded gate transistor 40 (MOS gated drift region 26a, channel 30 and source 26b) to be approximately 5–10 volts. The existence of this voltage on the MOS gated drift region 26a creates a negative voltage on the MOS gated drift region 26a relative to the voltage in the drain drift region 14 and therefore makes the MOS gated drift region 26a, lying over the first insulating layer 24b, operate as a field plate, thus pushing electrons in the drain drift region 14 down toward the substrate 12. This causes the drain drift region 14 to deplete in two directions, from the substrate 12-drain drift region 14 junction up towards the insulating layer 24b and from the drain drift region 14-insulating layer 24b junction down towards the substrate 12. This "top and bottom" dual depletion condition allows the drain drift region 14 to be doped more heavily during processing to further improve RDSon performance. RDSon is reduced when the transistor 10 is operating in the "on" mode and therefore the transistor 10 more accurately simulates an ideal switch.

The insulating layer 24b formed over the drain drift region 14 has a minimum thickness dictated by the breakdown voltage required by the design application. This is required because the voltage drop across the insulating layer 24b near the drain contact diffusion 16 will approximate the breakdown voltage. As applications require an increased breakdown voltage the insulating layer 24b thickness over the drain drift region 14 must also increase to prevent the insulating layer 24b form breaking down.

Although the invention has been described with reference to the preferred embodiment herein, this description is not to be construed in a limiting sense. Various modifications of the disclosed embodiment, such as modifications to drain drift region 14 length, depth or doping concentration, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A high voltage power transistor, comprising:
   a source isolated, embedded gate MOS transistor having a gate region formed in a semiconductor substrate, and having a source region, a drain region, and a channel region, wherein the source region and the drain region are separated by the channel region which is located above the gate region and the source region, drain region and channel region overlie an insulating layer covering a portion of the substrate; and
   a bulk semiconductor drain drift region connected to the drain region through an opening in the insulating layer of the source isolated, embedded gate MOS transistor.

2. The high voltage power transistor of claim 1 wherein the source isolated, embedded gate MOS transistor comprises:
   a substrate of semiconductor material;
   a diffusion formed in the substrate whereby a gate isolation diffusion is formed;
   a second diffusion of higher doping concentration than the gate isolation diffusion formed in the gate isolation diffusion whereby a gate diffusion is formed;
   an insulating layer overlying the source isolated, embedded gate transistor whereby a gate oxide is formed over the gate diffusion; and
   a semiconductor layer deposited over the insulating layer having three sections, one section forming a source for both the source isolated, embedded gate MOS transistor and the high voltage power transistor, a second section forming a channel, and a third section forming a drain.

3. The source isolated, embedded gate MOS transistor of claim 2 wherein the substrate and the channel are composed of P type semiconductor material, the gate isolation diffusion is composed of N− type semiconductor material, and the gate diffusion, source, and drain are composed of N+ type semiconductor material.

4. The source isolated, embedded gate MOS transistor of claim 2 wherein the substrate, gate isolation diffusion, gate diffusion, and semiconductor layer having three sections are composed of single crystal silicon.

5. The source isolated, embedded gate MOS transistor of claim 2 wherein the semiconductor layer having three sections is composed of polycrystalline silicon.

6. The source isolated, embedded gate transistor of claim 2 wherein the insulating layer overlying the substrate is either silicon dioxide, silicon nitride, or a combination of silicon dioxide and silicon nitride.

7. The high voltage power transistor of claim 1 wherein the drain drift region comprises:
- a substrate of semiconductor material;
- a diffusion in the substrate whereby a drift region is formed;
- a first diffusion, inside the drift region, of higher doping concentration than the drift region whereby a drain contact region is formed;
- a second diffusion, spaced from the first diffusion and inside the drift region, of higher doping concentration than the drift region whereby a drain drift region contact is formed;
- a patterned insulating layer overlying the drain drift region with openings for contact down to the first and second diffusions inside the drift region; and
- a patterned conductive layer making electrical contact to both the second diffusion inside the drift region and to a drain of the source isolated, embedded gate transistor.

8. The drain drift region of claim 7 wherein the substrate is P type semiconductor material, the drift region is N type semiconductor material, and both first and second diffusions inside the drift region are N+ type semiconductor material.

9. The drain drift region of claim 8 wherein the P type substrate doping concentration and the N type drift region depth and doping profile are designed according to RESURF design principles such that the drift region fully depletes at or before rated breakdown voltage of the high voltage power transistor.

10. The high voltage power transistor of claim 1 wherein the drain drift region comprises:
- a substrate of semiconductor material;
- a diffusion in the substrate whereby a drift region is formed;
- a first diffusion, inside the drift region, of higher doping concentration than the drift region whereby a drain contact region is formed;
- a second diffusion, spaced from the first diffusion and inside the drift region, of higher doping concentration than the drift region whereby a drain drift region contact is formed;
- a patterned insulating layer overlying the drain drift region with openings for contact down to the first and second diffusions inside the drift region; and
- a patterned conductive layer overlying the patterned insulating layer having two sections, one section making electrical contact to both the second diffusion inside the drift region and to a drain of the source isolated, embedded gate transistor, and a second section lying between the first and second diffusions inside the drift region whereby a field plate is formed.

11. The drain drift region of claim 10 wherein the substrate is P type semiconductor material, the drift region is N type semiconductor material, and the first and second diffusions inside the drift region are N+ type semiconductor material.

12. The drain drift region of claim 10 wherein the conductive layer is electrically connected to either source, gate, or drain terminal of the source isolated, embedded gate transistor, or is held at a potential below that of the drain terminal of the high voltage power device.

13. The drain drift region of claim 10 wherein the P type substrate doping concentration and the N type drift region depth and doping profile are designed according to RESURF design principles such that the drift region fully depletes at or before rated breakdown voltage of the high voltage power transistor.

14. A high voltage power transistor with electrical isolation between source and substrate, comprising:
- a drain drift region formed in a semiconductor substrate having a drain contact and an interconnect contact; and
- a source isolated, embedded gate MOS transistor having a source region formed on an insulating layer overlying the substrate, a drain region forming a drain interconnect formed on the insulating layer, the source region and the drain region separated by a channel region that also overlies the insulating layer, a gate region formed in the substrate and located below the channel, a source contact connected to the source region, a gate contact connected to the gate region through an opening in the channel and the insulating layer, and the drain interconnect connected to the interconnect contact of the drain drift region through an opening in the insulating layer.

15. A high side driver configuration with a high voltage power transistor having its source region isolated from the substrate, comprising:
- a drain drift region formed in a semiconductor substrate having a drain contact and an interconnect contact with the drain contact connected to a power supply; and
- a source isolated, embedded gate MOS transistor having a source region formed on an insulating layer overlying the substrate, a drain region forming a drain interconnect formed on the insulating layer, the source region and drain region separated by a channel region that also overlies the insulating layer, a gate region formed in the substrate and located below the channel, a source contact connected to the source region, a gate contact connected to the gate region through an opening in the channel and the insulating layer, and the drain interconnect connected to the interconnect contact of the drain drift region through an opening in the insulating layer.

* * * * *